United States Patent
Murao

(10) Patent No.: US 8,519,787 B2
(45) Date of Patent: Aug. 27, 2013

(54) HIGH FREQUENCY AMPLIFIER, WIRELESS DEVICE, AND CONTROL METHOD

(75) Inventor: Yoji Murao, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/139,790

(22) PCT Filed: Dec. 3, 2009

(86) PCT No.: PCT/JP2009/006593
§ 371 (c)(1),
(2), (4) Date: Jun. 15, 2011

(87) PCT Pub. No.: WO2010/084544
PCT Pub. Date: Jul. 29, 2010

(65) Prior Publication Data
US 2011/0285460 A1    Nov. 24, 2011

(30) Foreign Application Priority Data
Jan. 26, 2009    (JP) .................................. 2009-014147

(51) Int. Cl.
*H03F 3/68*    (2006.01)
(52) U.S. Cl.
USPC ...................................... 330/124 R; 330/295
(58) Field of Classification Search
USPC ................ 330/124 R, 295, 84, 286, 53, 296, 330/136
See application file for complete search history.

(56) References Cited

U.S. PATENT DOCUMENTS

| 7,518,449 | B2 * | 4/2009 | Iwasaki | 330/124 R |
| 2004/0174212 | A1 * | 9/2004 | Kim et al. | 330/124 R |

FOREIGN PATENT DOCUMENTS

| EP | 1492228 A1 | 12/2004 |
| JP | 2000513535 A | 10/2000 |
| JP | 2008124947 A | 5/2008 |
| JP | 2008227598 A | 9/2008 |
| JP | 2009094803 A | 4/2009 |

OTHER PUBLICATIONS

P. Midya et al., "Tracking power converter for supply modulation of RF power amplifiers," 2001 IEEE 32nd Annual Power Electronics Specialists Conference (PESC), 3(17-21):1540-1545 (2001).
International Search Report for PCT/JP2009/006593 mailed Jan. 12, 2010.
Japanese Office Action for JP2010-547316 mailed on Aug. 21, 2012.

* cited by examiner

*Primary Examiner* — Hieu Nguyen

(57) ABSTRACT

Provided is a high frequency amplifier that can suppress from increasing the circuit size while improving efficiency at the time of low output. A high frequency amplifier according to one aspect of the present invention includes a carrier amplifier 7 that amplifies an input signal, a peak amplifier 8 that amplifies the input signal with a predetermined amplitude or greater among the input signal, an envelope detector 3 that extracts envelope information of the input signal, and a bias control circuit 4 that calculates a calculation voltage to be supplied to the carrier amplifier 7 according to the envelope information, compares the calculation voltage and a threshold, and changes the calculation voltage to be supplied to the carrier amplifier 7.

11 Claims, 6 Drawing Sheets

HIGH FREQUENCY AMPLIFIER, WIRELESS DEVICE, AND CONTROL METHOD

This application is the National Phase of PCT/JP2009/006593, filed Dec. 3, 2009, which is based upon and claims the benefit of priority from Japanese patent application No. 2009-014147, filed on Jan. 26, 2009, the disclosure of which is incorporated herein in its entirety by reference.

TECHNICAL FIELD

The present invention relates to a high frequency amplifier, a wireless device, and a control method, and especially to a Doherty type high frequency amplifier including a carrier amplifier and a peak amplifier, a wireless device, and a control method.

BACKGROUND ART

In a broadband communication system in recent years, a signal is used whose ratio (PAR: Peak-to-Average Power Ratio) between peak power and average power of a signal is about ten dB. In this case, in order to transmit information without an error, it is necessary to use the one which can transmit the peak power higher than the average transmission power by ten dB or more as a high frequency amplifier of a transmission stage. Generally, as for an amplifier, the larger the ratio between the peak power and average transmission power (back-off), the lower the power efficiency.

On the other hand, by the rise of environmental awareness, lower power consumption is also requested in a wireless system. Especially in a base station device of a mobile phone which is requested for high output of a few tens of W, a high frequency amplifier with a large power consumption ratio is desired to improve the efficiency. There are a Doherty type amplifier as a highly efficient high frequency amplifier and an amplifier of a drain modulation technique which synchronizes with an envelope of a signal and a drain voltage of an amplifying element.

In the Doherty type amplifier, only the carrier amplifier operates in a low output region, and both the carrier amplifier and the peak amplifier operate in a high output region. In the Doherty type amplifier, efficiency can be maximum in an output level in which the peak amplifier starts to operate, and thus it is possible to achieve high efficiency. Further, by changing a saturation output level ratio of the carrier amplifier and the peak amplifier, the output level in which the efficiency becomes maximum can be changed. However, in the low output region, the efficiency of the carrier amplifier biased to a class AB will be the efficiency of the Doherty type amplifier, and thus there has been a problem that the efficiency is reduced.

An envelope tracking amplifier which is an example of the drain modulation technique changes a power supply voltage of the amplifying element according to an envelope of a signal. For example, when the value of the envelope is small, lowering the power supply voltage maintains the low back-off state at any time, and thereby realizing a highly efficient operation. However, in a high frequency amplifier of a mobile phone base station, a signal band is several tens of MHz and a maximum output of the amplifying element will be several hundreds of W. Therefore, about 100 MHz high-speed operation, and several hundreds of W class of a high output operation are required, at the same time for a drain modulation power supply circuit which supplies electrical power to the amplifying element, and there has been a problem of increasing the circuit size.

PTL 1 describes a Doherty amplifier including a detector which detects an envelope of an input signal and a comparator which compares the envelope and a reference voltage. When the envelope is greater than or equal to the reference voltage, a pulse signal based on the size of instantaneous power of the envelope is output, and a drive signal according to the level of the output pulse signal is supplied to the carrier amplifier.

CITATION LIST

Patent Literature

PTL 1: Japanese Unexamined Patent Application Publication No. 2008-227598

SUMMARY OF INVENTION

Technical Problem

In PTL 1, a pulse signal is added when the envelope exceeds a reference value, however as described in the paragraph 0011, there is a problem that it is optimized only to the electrical power with the probability of occurrence of about 1%.

The present invention is made in light of such circumstances, and the purpose of the present invention is to provide a high frequency amplifier, a wireless device, and a control method that suppress from increasing the circuit size while improving the efficiency at the time of low output.

Solution to Problem

A high frequency amplifier according to one aspect of the present invention includes a carrier amplifier that amplifies an input signal, a peak amplifier that amplifies the input signal with a predetermined amplitude or greater among the input signal, an envelope extraction unit that extracts envelope information of the input signal, a calculation unit that calculates a calculation voltage to be supplied to the carrier amplifier according to the envelope information, and a power supply modulation unit that compares the calculation voltage and a threshold and changes the voltage to be supplied to the carrier amplifier, in which the high frequency amplifier combines and outputs an amplified output of the carrier amplifier and the peak amplifier.

A control method according to one aspect of the present invention is the control method of a high frequency amplifier for combining and outputting an amplified output of a carrier amplifier and a peak amplifier, which includes the carrier amplifier that amplifies an input signal, and a peak amplifier that amplifies the input signal with a predetermined amplitude or greater among the input signal, in which the control method includes extracting envelope information of the input signal, calculating a calculation voltage to be supplied to the carrier amplifier according to the envelope information, and comparing the calculation voltage with a threshold, and changing the voltage to be supplied to the carrier amplifier.

Advantageous Effects of Invention

According to the present invention, it is possible to provide a high frequency amplifier, a wireless device, and a control method that suppress from increasing the circuit size while improving the efficiency at the time of low output.

DESCRIPTION OF EMBODIMENTS

First Exemplary Embodiment

Figure 1:
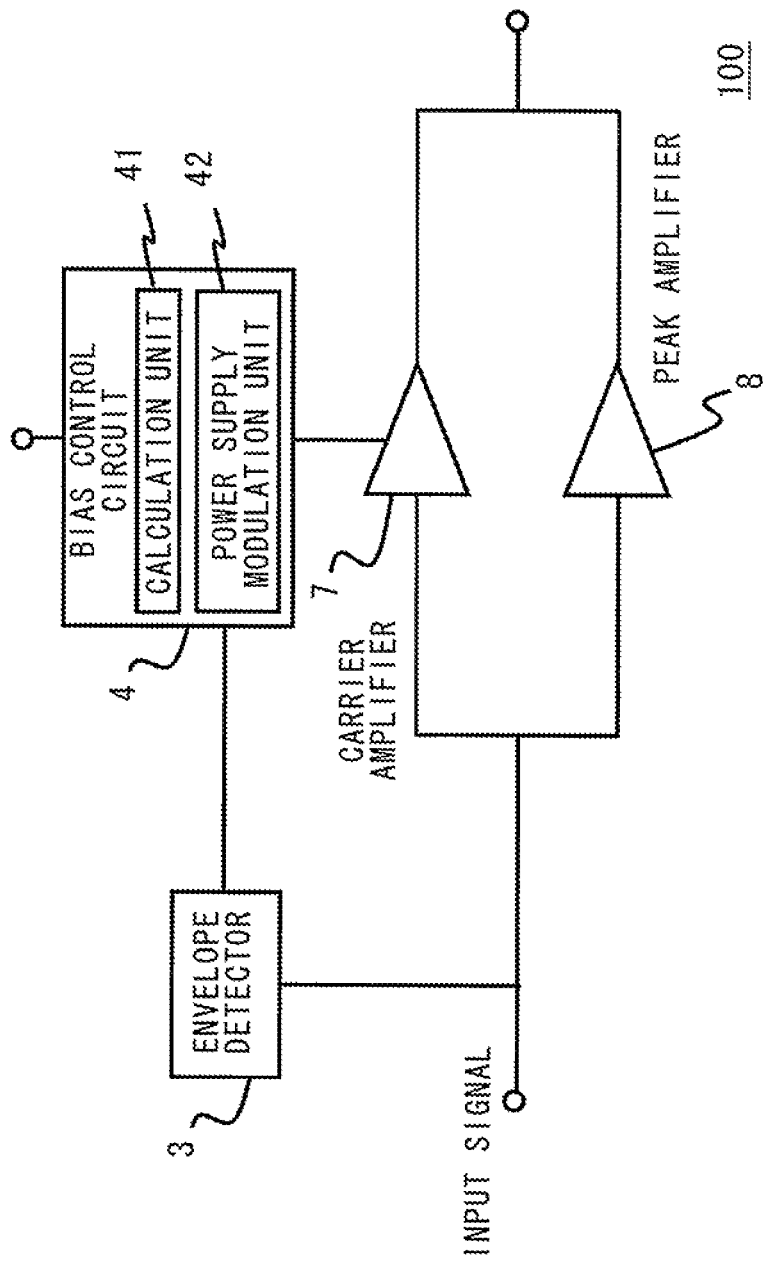
FIG. 1 is a view showing an example of a configuration of a high frequency amplifier according to a first exemplary embodiment.

A high frequency amplifier according a first exemplary embodiment of the present invention is explained with reference to FIG. 1. FIG. 1 is a view showing a configuration of a high frequency amplifier 100 according to this exemplary embodiment. As shown in FIG. 1, the high frequency amplifier 100 is provided with an envelope detector 3, a bias control circuit 4, a carrier amplifier 7, and a peak amplifier 8.

The high frequency amplifier 100 according to this exemplary embodiment is provided with a Doherty amplifier including the carrier amplifier 7 and the peak amplifier 8. The carrier amplifier 7 amplifies an input signal input from outside, and amplifies the input signal with a predetermined amplitude or greater among the input signal of the peak amplifier 8.

The envelope detector 3 extracts envelope information of the input signal. A calculation unit 41 for calculating a calculation voltage to be supplied to the carrier amplifier 7 according to the extracted envelope information and a power supply modulation unit 42 which compares the calculation voltage and a threshold and changes the voltage to be supplied to the carrier amplifier are provided in the bias control circuit 4. The high frequency amplifier 100 combines and outputs an amplified output of the carrier amplifier 7 and the peak amplifier 8.

Figure 2:
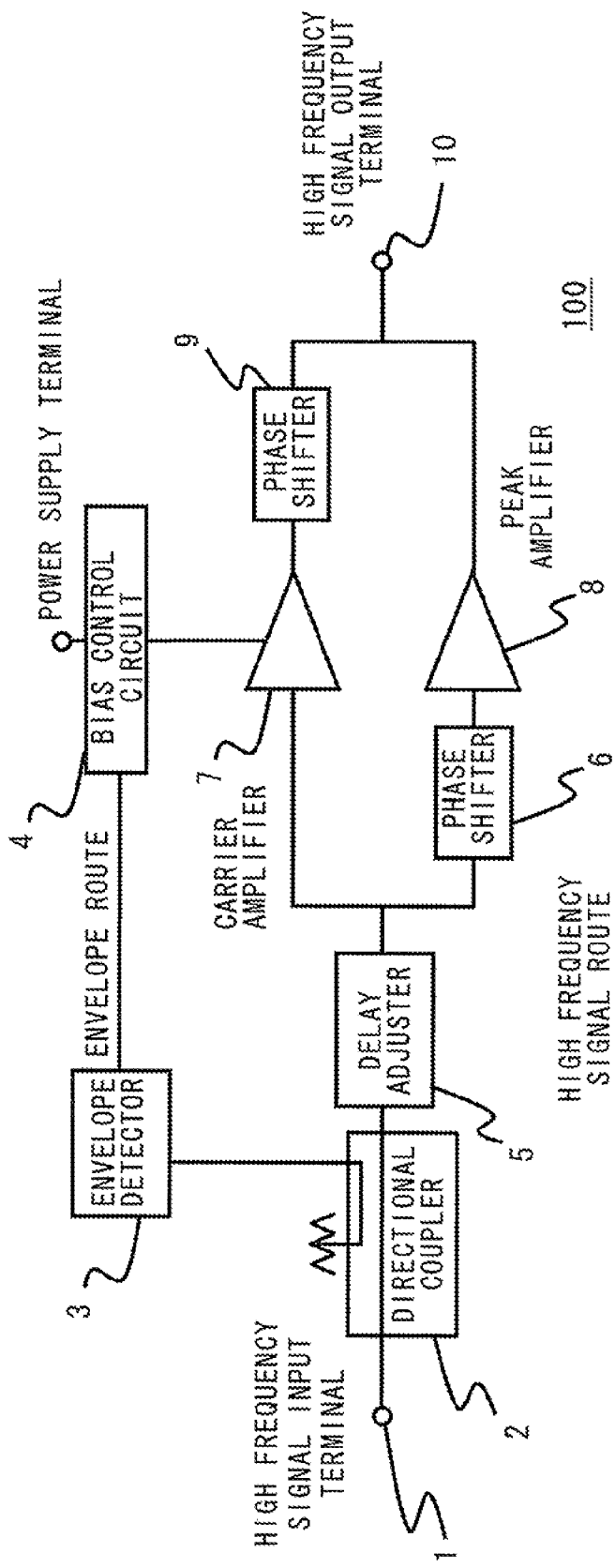
FIG. 2 is a view showing an example of the configuration of the high frequency amplifier according to the first exemplary embodiment.

Here, with reference to FIG. 2, a specific configuration of the high frequency amplifier 100 shown in FIG. 1 is explained. FIG. 2 is a view showing the configuration of the high frequency amplifier 100 according to this exemplary embodiment. As shown in FIG. 2, the high frequency amplifier 100 includes a high frequency signal input terminal 1, a directional coupler 2, the envelope detector 3, the bias control circuit 4, the delay adjuster 5, phase shifters 6 and 9, the carrier amplifier 7, the peak amplifier 8, and a high frequency signal output terminal 10.

The directional coupler 2 separates a high frequency signal input from the high frequency signal input terminal 1 into a high frequency signal route and an envelope route. The delay adjuster 5 is provided in the high frequency signal route. The delay adjuster 5 adjusts the high frequency signal input via the directional coupler 2 in order to eliminate the delay difference between the high frequency signal route and the envelope route. The high frequency signal adjusted by the delay adjuster 5 is branched into two paths.

The carrier amplifier 7 and the phase shifter 9 are provided in one of the branched path in this order. One of the branched high frequency signal is amplified by the carrier amplifier 7, and the phase is adjusted by the phase shifter 9. The phase shifter 6 and the peak amplifier 8 are provided in the other path in this order. The phase of other high frequency signal is adjusted by the phase shifter 6, and then amplified by the peak amplifier 8. The signal from the phase shifter 9 and the peak amplifier 8 is combined, and is output from the high frequency signal output terminal 10.

Figure 3:
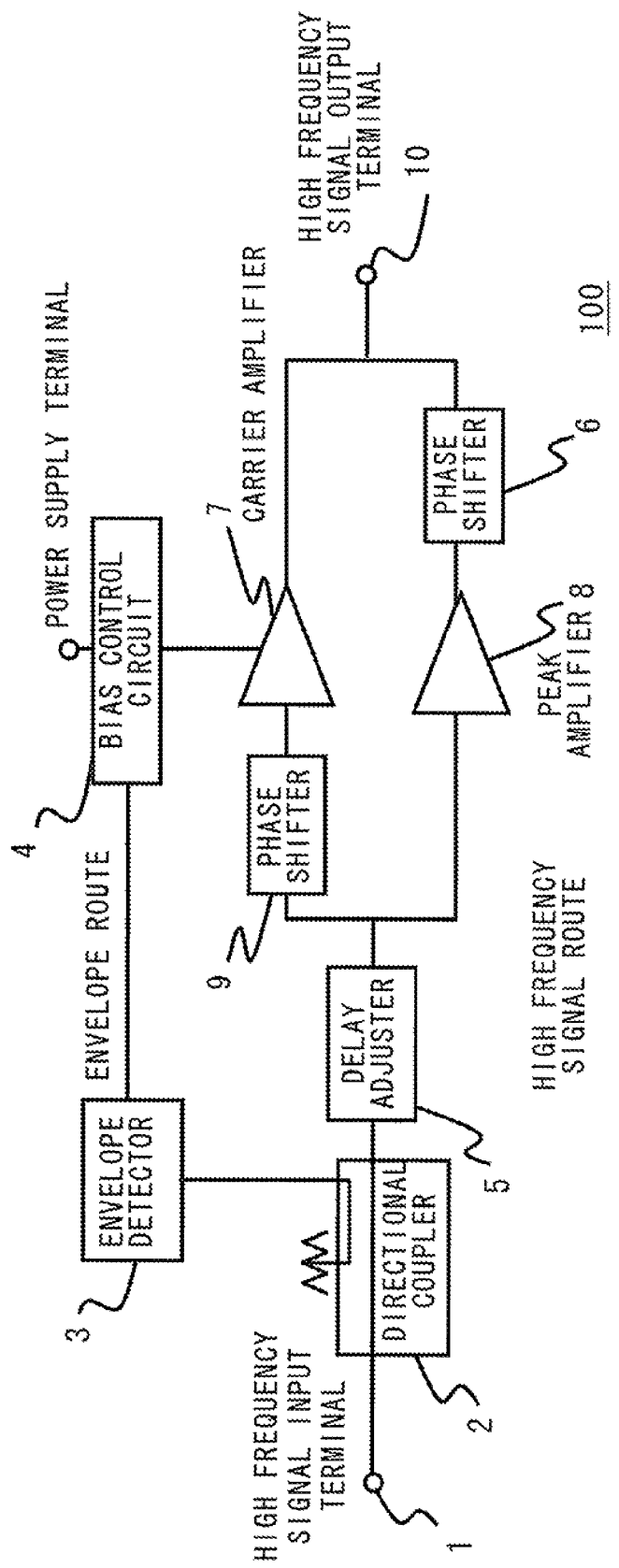
FIG. 3 is a view showing another example of the configuration of the high frequency amplifier according to the first exemplary embodiment.

Note that as shown in FIG. 3, in the high frequency signal route, it is possible to use an inverted Doherty amplifier in which the order of the carrier amplifier 7 and the peak amplifier 8 is inverted, and also the order of the phase shifter 6 and the peak amplifier 8 is inverted.

The envelope detector 3 and the bias control circuit 4 are provided in the envelope route. The envelope detector 3 extracts the envelope information (envelope) of the high frequency signal input. The bias control circuit 4 outputs a drive voltage to the carrier amplifier 7 according to the envelope information extracted in the envelope detector 3. Accordingly, the bias control circuit 4 changes the voltage supplied to the carrier amplifier 7 according to the envelope information.

Figure 4:
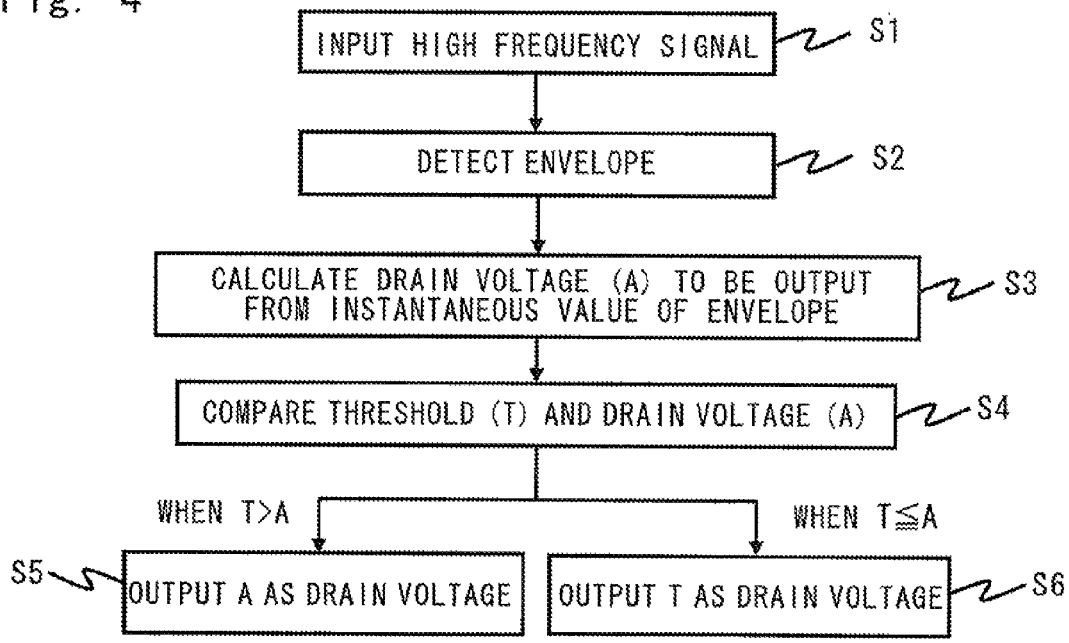
FIG. 4 is a flowchart explaining an operation of the high frequency amplifier according to the first exemplary embodiment.

A specific operation in the envelope route of the high frequency amplifier 100 according to this exemplary embodiment is explained with reference to FIG. 4. FIG. 4 is a flowchart for explaining the operation of the high frequency amplifier 100.

When the high frequency signal separated by the directional coupler 2 is input to the envelope detector 3 (step S1), envelope detection is performed by the envelope detector 3 (step S2), and the envelope information is extracted. The extracted envelope information is input to the bias control circuit 4. In the bias control circuit 4, a drain voltage (A) which should be applied to the carrier amplifier 7 according to the envelope information is calculated (step S3).

Then, the calculated drain voltage (A) and a prespecified threshold (T) are compared (step S4). When the threshold (T) is greater than the drain voltage (A), the calculated drain voltage (A) is output to the carrier amplifier 7 as the drive voltage (step S5). On the other hand, when the threshold (T) is less than or equal to the drain voltage (T<=A), the threshold (T) is output as the drive voltage (step S6).

As a calculation method of the drain voltage (A) which should be applied to the carrier amplifier 7, there is a method of using a contrast table of the prespecified envelope information and the drain voltage (A).

There is a following example as the calculation method of the drain voltage (A) using the contrast table. As the contrast table, a table to which the envelope information and the value of the drain voltage (A) are made to correspond shall be stored.

(1) The calculation unit 41 calculates the drain voltage (A) corresponding to the value closest to the input value of the envelope among the values of the envelope in the contrast table.

(2) When the input value of the envelope differs from the value of the envelope in the contrast table, the calculation unit 41 calculates the drain voltage (A) corresponding to a value, which is larger than and closest to the input value of the envelope among the values of the envelope in the contrast table.

(3) When the input value of the envelope differs from the value of the envelope in the contrast table, the calculation unit 41 calculates the drain voltage (A) corresponding to a value, which is smaller than and closest to the input value of the envelope.

(4) When an input value (BO) of the envelope differs from the value of the envelope in the contrast table, the calculation unit 41 reads a drain voltage (A1), which corresponds to a value (B1) larger than and closest to the input value of the envelope, and a drain voltage (A2), which corresponds to a value (B2) smaller than and closest to the input value of the envelope in the contrast table, interpolates them from (A1) and (A2) by the following formula, and calculates the drain voltage (A).

$$A=A2+((A1-A2)/(B1-B2))*(B0-B2)$$

Further, as other calculation method of the drain voltage (A), a method may be used in which polynomial approximation is performed to the relationship between the envelope information and the drain voltage (A), and the drain voltage (A) is obtained from the envelope information. For example, when the envelope information is x, it can be obtained using the following formula.

$$A=a0+a1 \cdot x+a2 \cdot x^2+\ldots +an \cdot x^n$$

Note that a0 to an are coefficients and n shall be a natural number.

Figure 5:
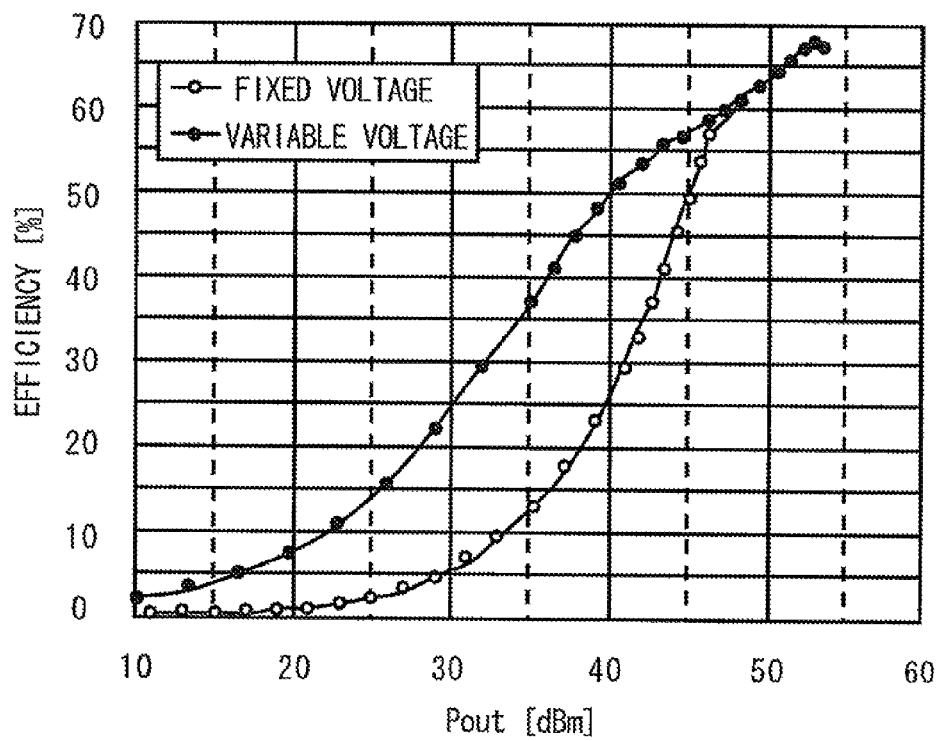
FIG. 5 is a graph showing a calculation result example of efficiency of an output level of the high frequency amplifier according to the first exemplary embodiment.

FIG. 5 shows a calculation result example of the efficiency for the output level. In FIG. 5, the horizontal axis indicates the output level (Pout) and the vertical axis indicates the efficiency (Efficiency). The black dots "Variable Voltage" are results of the high frequency amplifier 100 according to this exemplary embodiment, and the white dots "Fixed Voltage" are results of a conventional Doherty amplifier. Note that as for the conventional Doherty amplifier, the drain voltage of the carrier amplifier is fixed.

From FIG. 5, it can be seen that in the high frequency amplifier 100 according to this exemplary embodiment, the efficiency in the low output region (output level of 46 dBm or less) is improved compared to the conventional Doherty amplifier. For example, 20 points or more are improved at the output level of 35 dBm.

Thus, according to the present invention, the drain voltage (A) calculated according to the envelope information and the threshold (T) are compared, and the drain voltage to be supplied to the carrier amplifier 7 is determined. In PTL 1, there has been a problem in which although the pulse signal is added when the envelope exceeds the reference value, the optimization can be performed only to the electrical power with the probability of occurrence of about 1%. However, in the present invention, when it falls below the reference value, it is possible to change the power supply voltage according to the envelope. For example, when the reference value is specified to the same value as PTL 1, the power supply voltage is optimized to the electric power with the probability of occurrence of 99%. As described above, it is possible to optimize the drain voltage to be supplied to the carrier amplifier 7. Then it becomes possible to improve the efficiency in the low output region.

Further, in the present invention, since the bias control circuit 4, which is a modulation power supply unit, may operate only the carrier amplifier 7, thus half (in the example shown in FIG. 5, 107 W) of the saturation output (in the example shown in FIG. 5, 53.3 dBm=214 W) may be output. On the other hand, in the drain modulation method such as the conventional envelope tracking, it is required to output up to the saturation output. Therefore, according to the present invention, it becomes possible to reduce the circuit size of the modulation power supply unit.

Note that although the abovementioned explanation assumed a FET (Field effect transistor) as the carrier amplifier 7, and explained the power supply terminal as the drain, it is not limited to this. For example, it may be a bipolar transistor as the amplifier, and in that case, the drain may be read as the collector in the above explanation.

Second Exemplary Embodiment

Figure 6:
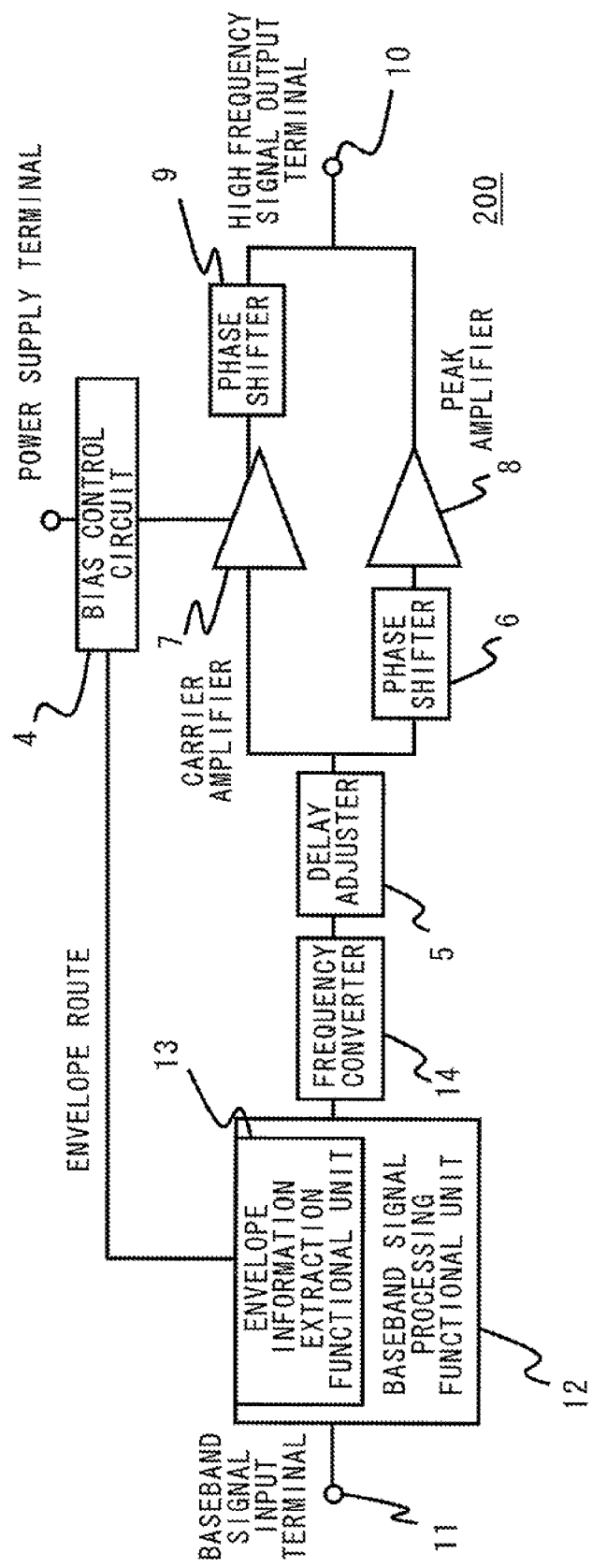
FIG. 6 is a view showing a configuration of a wireless device according to a second exemplary embodiment.

A configuration of a wireless device according to a second exemplary embodiment of the present invention is explained with reference to FIG. 6. FIG. 6 is a view showing a configuration of a wireless device 200 according to this exemplary embodiment. In FIG. 6, similar components as FIG. 2 are denoted by the same numerals, and the explanation is omitted.

As shown in FIG. 6, the wireless device 200 includes a bias control circuit 4, a delay adjuster 5, phase shifters 6 and 9, a carrier amplifier 7, a peak amplifier 8, a high frequency signal output terminal 10, a baseband signal input terminal 11, a baseband signal processing functional unit 12, an envelope information extract functional unit 13, and a frequency converter 14. The wireless device 200 according to this exemplary embodiment includes a Doherty amplifier.

In this exemplary embodiment, the envelope information extract functional unit 13 is provided in the baseband signal processing functional unit 12. The envelope information extract functional unit 13 extracts the envelope information included in a baseband signal. In this exemplary embodiment, the bias control circuit 4 changes the voltage supplied to the carrier amplifier 7 according to the envelope information by a digital signal process. In such a case, since signal processing in the bias control circuit 4 can be realized in digital signal processing by treating the envelope information as the baseband signal as mentioned above, a circuit configuration can be easy.

Third Exemplary Embodiment

Figure 7:
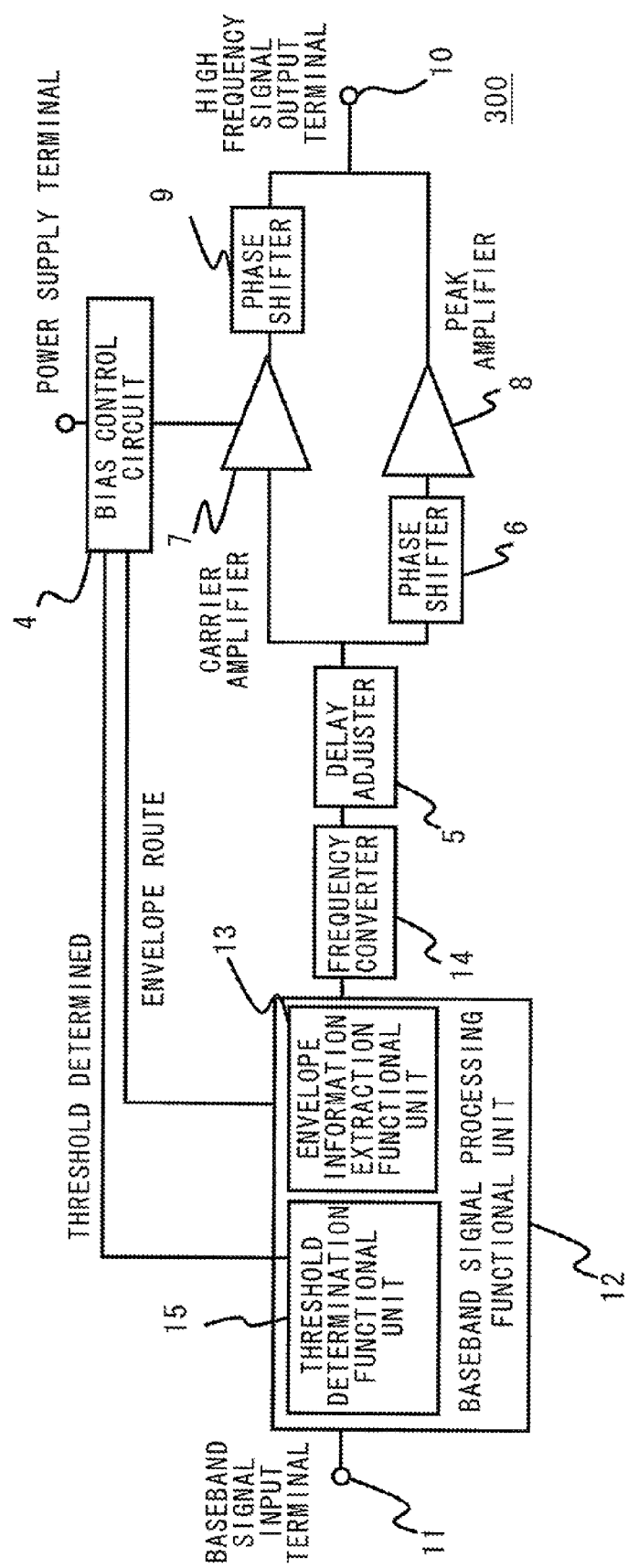
FIG. 7 is a view showing a configuration of a wireless device according to a third exemplary embodiment.

A configuration of a wireless device according to a third exemplary embodiment of the present invention is explained with reference to FIG. 7. FIG. 7 is a view showing a configuration of a wireless device 300 according to this exemplary embodiment. In FIG. 7, similar components as FIGS. 2 and 5 are denoted by the same numerals, and the explanation is omitted.

As shown in FIG. 7, in addition to the wireless device 200 shown in FIG. 6, the wireless device 300 includes a threshold determination functional unit 15. The threshold determination functional unit 15 is provided in the baseband signal processing functional unit 12. The threshold determination functional unit 15 determines a threshold held in the bias control circuit 4 by signal information such as PAR and necessary EVM (Error Vector Magnitude).

A threshold setting signal determined by the threshold determination functional unit 15 is transmitted to the bias control circuit 4. The threshold (T) in the bias control circuit 4 is changed by this threshold setting signal. For example, in the wireless device which transmits a different modulated signal, optimal PAR may change depending on the signal and the saturation output of an optimal amplifier may change in connection with that.

When the threshold (T) is increased, the saturation output level of the carrier amplifier 7 is increased, and thereby making it possible to increase the saturation output of the entire high frequency amplifier. Conversely, since the saturation power level of the carrier amplifier 7 is reduced when the threshold (T) is reduced, the saturation output of the high frequency amplifier is also reduced.

As explained above, according to the present invention, while the efficiency in the low output region can be improved, it becomes possible to reduce the circuit size. Moreover, by changing the threshold according to PAR and the necessary EVM or the like, it is possible to increase the saturation output. The present invention is not limited to the above exemplary embodiments, but can be modified as appropriate without departing from the scope.

This application is based upon and claims the benefit of priority from Japanese patent application No. 2009-014147, filed on Jan. 26, 2009, the disclosure of which is incorporated herein in its entirety by reference.

INDUSTRIAL APPLICABILITY

The present invention can be applied to a device using a Doherty type high frequency amplifier including a carrier frequency and a peak amplifier.

REFERENCE SIGNS LIST

1 HIGH FREQUENCY SIGNAL INPUT TERMINAL
2 DIRECTIONAL COUPLER
3 ENVELOPE DETECTOR
4 BIAS CONTROL CIRCUIT
5 DELAY ADJUSTER
6 PHASE SHIFTER
7 CARRIER AMPLIFIER
8 PEAK AMPLIFIER
9 PHASE SHIFTER
10 HIGH FREQUENCY SIGNAL OUTPUT TERMINAL
11 BASEBAND SIGNAL INPUT TERMINAL
12 BASEBAND SIGNAL PROCESSING FUNCTIONAL UNIT
13 ENVELOPE INFORMATION EXTRACTION FUNCTIONAL UNIT
14 FREQUENCY CONVERTER
15 THRESHOLD DETERMINATION FUNCTIONAL UNIT
41 CALCULATION UNIT
42 POWER SUPPLY MODULATION UNIT
100 HIGH FREQUENCY AMPLIFIER
200 WIRELESS DEVICE
300 WIRELESS DEVICE

The invention claimed is:

1. A high frequency amplifier comprising:
a carrier amplifier that amplifies an input signal;
a peak amplifier that amplifies the input signal with a predetermined amplitude or greater among the input signal;
an envelope extraction unit that extracts envelope information of the input signal;
a calculation unit that calculates a calculation voltage to be supplied only to the drain or collector of the carrier amplifier according to the envelope information; and
a power supply modulation unit that compares the calculation voltage and a threshold and changes the voltage to be supplied only to the drain or collector of the carrier amplifier, wherein
the high frequency amplifier combines and outputs an amplified output of the carrier amplifier and the peak amplifier, and
the power supply modulation unit outputs the calculation voltage which fluctuates according to the envelope information when the calculation voltage is lower than the threshold, and the constant threshold is output when the calculation voltage is higher than the threshold.

2. The high frequency amplifier according to claim 1, wherein the calculation unit determines the calculation voltage by a contrast table that is stored corresponding to the envelope information.

3. The high frequency amplifier according to claim 1, wherein the calculation unit determines the calculation voltage using a polynomial from the envelope information.

4. The high frequency amplifier according to claim 1, wherein the carrier amplifier and the peak amplifier compose a Doherty amplifier or an inverted Doherty amplifier.

5. A wireless device comprising:
a baseband processing functional unit; and
the high frequency amplifier according to claim 1,
wherein the envelope information extraction unit is provided in the baseband processing functional unit and extracts the envelope information included in a baseband signal.

6. The wireless device according to claim 5, further comprising a threshold determination functional unit that changes the threshold according to signal information from the baseband processing functional unit.

7. A control method of a high frequency amplifier for combining and outputting an amplified output of a carrier amplifier and a peak amplifier and including the carrier amplifier that amplifies an input signal, and a peak amplifier that amplifies the input signal with a predetermined amplitude or greater among the input signal, the control method comprising:
extracting envelope information of the input signal;
calculating a calculation voltage to be supplied only to the drain or collector of carrier amplifier according to the envelope information; and
comparing the calculation voltage with a threshold, and changing the voltage to be supplied only to the drain or collector of the carrier amplifier,
wherein comprising the calculation voltage which fluctuates according to the envelope information is output when the calculation voltage is lower than the threshold and the constant threshold is output when the calculation voltage is higher than the threshold.

8. The control method according to claim 7, wherein the calculation voltage is determined by a contrast table that is stored corresponding to the envelope information.

9. The control method according to claim 7, wherein the calculation voltage is determined using a polynomial from the envelope information.

10. The control method according to claim 7, wherein the input signal is a baseband signal and extracts the envelope information included in the baseband signal.

11. The control method according to claim 10, wherein the threshold is changed according to baseband signal information.

* * * * *